United States Patent [19]
Armstrong et al.

[11] Patent Number: 4,593,383
[45] Date of Patent: Jun. 3, 1986

[54] INTEGATED CIRCUIT MEMORY

[75] Inventors: Bruce G. Armstrong, Belmont; Fabio Principi, Cupertino; John G. Marcellino, Oakland, all of Calif.

[73] Assignee: Raytheon Company, Lexington, Mass.

[21] Appl. No.: 548,068

[22] Filed: Nov. 2, 1983

[51] Int. Cl.$^4$ .............................................. G11C 13/00
[52] U.S. Cl. .................................... 365/203; 365/189
[58] Field of Search ........................ 365/203, 189, 230

[56] References Cited
U.S. PATENT DOCUMENTS 4,161,040 7/1979 Satoh .................................. 365/203
4,368,529 1/1983 Furuyama ........................... 365/203

Primary Examiner—Terrell W. Fears
Attorney, Agent, or Firm—Richard M. Sharkansky; Denis G. Maloney; John T. Meaney

[57] ABSTRACT

An integrated circuit memory is disclosed having a power switch circuit which, in response to an enable signal, initially addresses a plurality of rows of memory elements during an initial pre-enable condition and which subsequently places the memory in the full enable condition to allow the address signal to address only a selected one of the plurality of memory elements. During a standby mode the rows of conductors coupled to the rows of memory elements are at a relatively "high" voltage potential charging the large capacitance between the rows of conductors and a grounded substrate on which such conductors are formed. To address a particular row conductor and hence the memory elements coupled thereto during the enable mode, such row conductor must be coupled to ground potential. With the arrangement described above, by addressing a plurality of the addressed rows of conductors during the initial pre-enable condition, the relatively "high" voltage on the plurality of rows of conductors is coupled to ground potential thereby more effectively and more rapidly discharging the voltage on the plurality of the addressed rows of conductors to reduce the effect of the capacitance, and hence the response time, of the memory circuit to the enable signal.

3 Claims, 3 Drawing Figures

4,593,383

INTEGATED CIRCUIT MEMORY

BACKGROUND OF THE INVENTION

This invention relates generally to integrated circuit memories and more particularly integrated circuit memories having standby/power enable circuitry.

As is known in the art, integrated circuit memories have a wide range of applications. In some applications, as in so-called non-volatile memories where power is not required to retain stored data as in a read-only memory (ROM) or programmable read-only memory (PROM), decoupling of a power supply from the addressing circuitry of such memories during a standby mode is sometimes provided. In one type of bipolar PROM/ROM circuit, addressing signals are fed to the addressing circuit which includes two sections: An inverter/buffer section which, in response to the addressing signals, produces "true" and "complementary" signals for each one of the bits of the addressing signal fed to the addressing section; and a decoder section which, in response to the "true" and "complementary" signals, addresses one of a plurality of conductors of the memory array to which a row of memory elements is coupled. In one such type of bipolar ROM/PROM circuit the decoder section includes Schottky transistor-transistor-logic (TTL) gates and prior to enabling of such gates, that is prior to electrically coupling of such gates to a power source (as when the memory circuit is in the standby mode), the output of such gates, and hence the voltages on the rows of conductors, are a "high" voltage relative to the substrate on which such conductors are disposed. The plurality of conductors together with the substrate thus provide a capacitor. In order for the decoder to respond to the addressing signals once the memory is placed in the enable mode, that is once it is coupled to the power source, it is necessary to rapidly discharge the voltages on the conductors to ground and thereby reduce the effect of the capacitance on the delay, or the response time, of the memory to the enable signal.

SUMMARY OF THE INVENTION

In accordance with the present invention, an integrated circuit memory is provided wherein a plurality of rows of memory elements is addressed selectively in accordance with an address signal when such memory is placed in an enable condition, such memory circuit including a means, responsive to an enable signal, for addressing a plurality of the rows of memory elements during an initial pre-enable condition and for subsequently placing the memory in the full enable condition to allow the address signal to address the selected one of the rows of memory elements. With such arrangement, during the pre-enable condition a plurality of rows of the conductors coupled to the corresponding rows of memory elements is coupled to ground thereby to rapidly discharge a relatively "high" voltage which is present between the conductors and the substrate prior to placing the memory in the enable condition.

In accordance with a preferred embodiment of the invention, the memory circuit comprises an array of memory elements, each one thereof being associated with one of a plurality of rows of conductors and one of a plurality of columns of conductors, such array of memory elements and the pluralities of rows and columns of conductors being disposed on a common substrate. An addressing means includes a plurality of decoder circuits, each one thereof having an output coupled to a corresponding one of the plurality of rows of conductors, to produce a relatively "high" voltage at the output thereof when the memory circuit is in a standby mode (i.e. prior to such circuit being placed in an enable condition or a pre-enable condition) and to produce either a relatively "high" voltage or relatively "low" voltage at the output thereof selectively in accordance with input signals fed to such decoder circuit when such decoder circuit is placed in either the initial pre-enable condition or a subsequent full enable condition. The addressing means also includes an input means responsive to an enable signal for: placing the decoder circuits in the pre-enable condition and full enable condition; coupling to such decoder circuits, during the pre-enable condition, predetermined input signals to produce at the outputs of a plurality of such decoder circuits the relatively "low" voltage; and, coupling to such decoder circuits, during a subsequent full enable condition, input signals produced in response to an address signal to produce at the output of a selected one of the decoder circuits a "low" voltage and to produce at the outputs of the remaining ones of the decoder circuits the relatively "high" voltage to thereby address the one of the rows of memory elements selected in accordance with the address signal.

BRIEF DESCRIPTION OF THE DRAWINGS

The following features of this invention as well as the invention itself will be more fully understood from the following detailed description read together with the accompanying drawings in which.

DESCRIPTION OF THE PREFERRED EMBODIMENT

Figure 1:
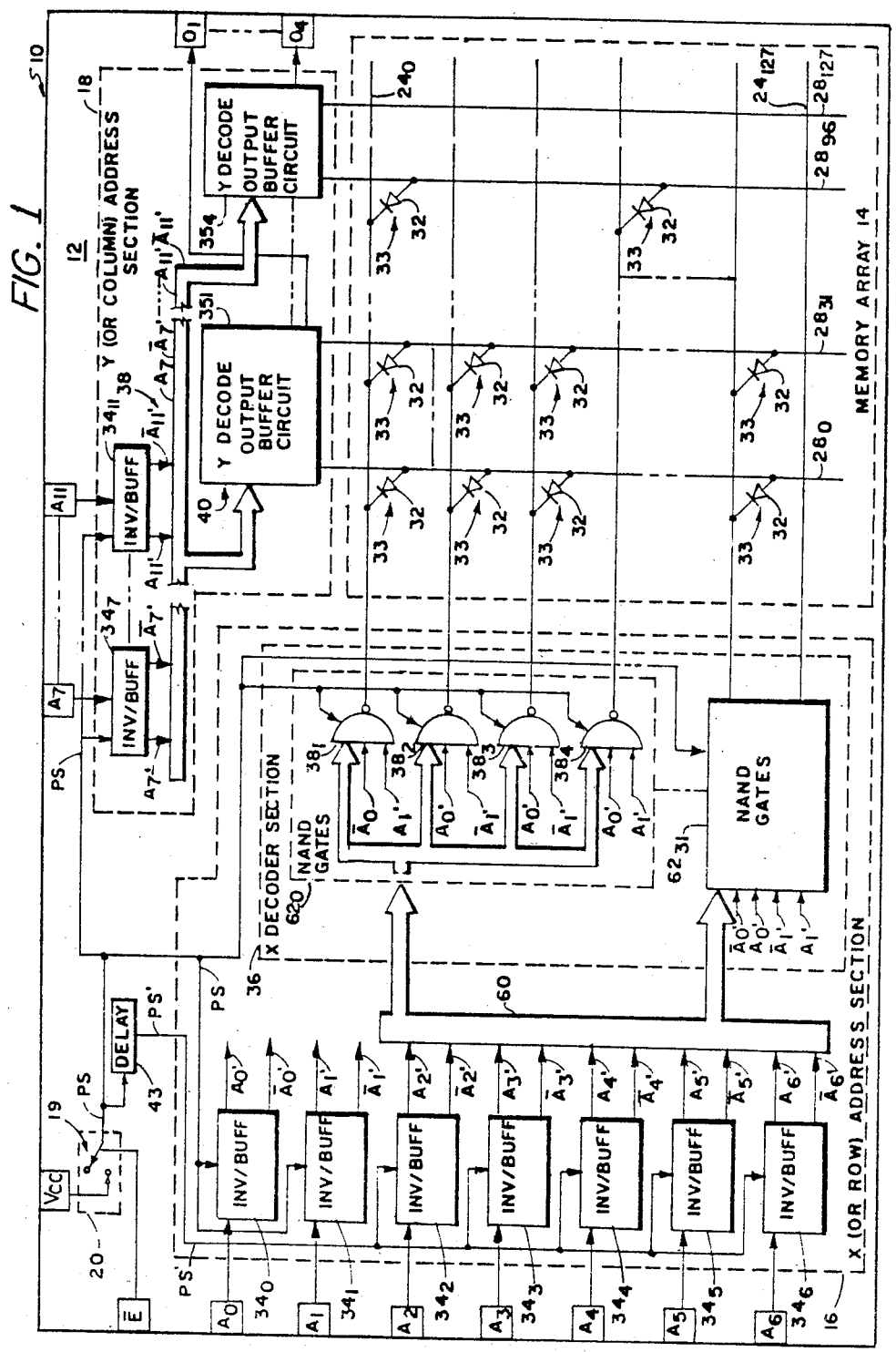
FIG. 1 is a schemtaic diagram of a programmable read-only memory (PROM) according to the invention.

Referring now to FIG. 1, a read-only memory (ROM) 10 is shown formed on a single crystal, grounded semiconductor substrate 12, here P-type conductively silicon having an N-type conductively epitaxial layer, using conventional monolithic integrated circuit fabrication techniques. Such ROM 10 includes: A memory array 14 adapted for storing, in a manner to be described, here 16,384 bits of information arranged as 4,096 four bit digital words; An X (or row) address section 16 and a Y (or column) addressing section 18 for addressing the 4,096 words in such array 14 in accordance with binary signals supplied from an address signal source (not shown) to input pads $A_0$–$A_{11}$; And for coupling the four bits of the addressed word to output terminals $O_1$–$O_4$; A read enable section 20 for enabling data stored in the array 14 to be read from the array 14 in response to a read enable signal fed to the terminal $\overline{E}$, or for placing the memory 10 in the standby mode in response to a standby signal fed to terminal $\overline{E}$, in a manner to be described. It is noted that in the absence of a read enable signal, i.e. with the memory 10 in the standby mode, a $+V_{CC}$ source is electrically decoupled from a power bus PS connected via switch 19 of program enable section 20 but that during reading mode (i.e. in response to the read enable signal) the $+V_{CC}$ source is coupled to such power bus PS'. It is noted that the power bus PS is connected to input stages of the addressing sections 16, 18 and, as will be described in detail hereinafter, when the $+V_{CC}$ source is decoupled from power bus PS there is substantially no power dissipated in the addressing sections 16, 18; however, such sections 16, 18 have output stages thereof coupled to the $+V_{CC}$ supply to produce at the output of such sections 16, 18 "high" or logical 1 signals.

The memory element array 14 includes 128 rows of conductors $24_0$-$24_{127}$ and four sets of 32 columns of conductors $28_0$-$28_{31}$, through $28_{96}$-$28_{127}$, as indicated. The rows and columns of conductors are, selectively, interconnected by conventional diodes 32 to provide conventional non-volatile read-only memory elements 33.

Figure 2:
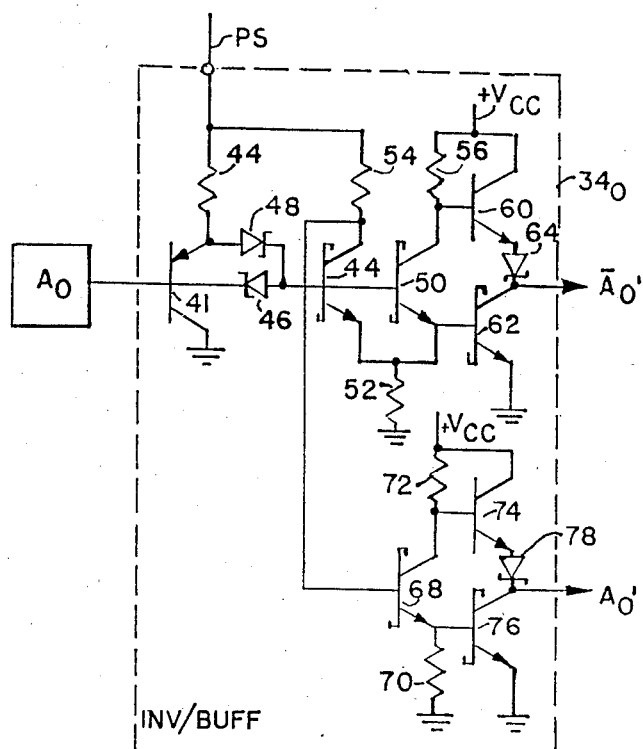
FIG. 2 is a schematic diagram of an inverter/buffer circuit used in the PROM circuit of FIG. 1.

The X addressing section 16 includes an X address inverter/buffer section 34 and an X decoder section 36 while the Y addressing section 18 includes input/buffer section 38 and a Y decoder and output circuit 40, as shown. Referring first to the X addressing section 16, such section 16 is shown to include a plurality, here seven, identical inverter/buffer circuits $34_0$-$34_6$ coupled to corresponding ones of the input terminals $A_0$-$A_6$, respectively, as shown. An exemplary one of the input/buffer circuits $34_0$-$34_6$, here input buffer circuit $34_0$, is shown in detail in FIG. 2. Such inverter/buffer circuit $34_0$ is shown to include a PNP transistor 41 having its base electrode connected to input pad $A_0$, its emitter coupled to a power bus PS through a resistor 44 and its collector electrode coupled to ground, as shown. The base electrode of transistor 41 is coupled to the base electrode of transistor 44 through a Schottky diode 46. The emitter electrode of transistor 41 is also coupled to the base electrode of transistor 44 through a Schottky diode 48. The base electrode of transistor 44 is connected to the base electrode of transistor 50, as shown. The emitter electrodes of transistors 44 and 50 are connected to ground through a resistor 52 as shown. The collector electrode of transistor 44 is connected to power bus PS through resistor 54. The collector of transistor 50 is connected to $+V_{CC}$ through resistor 56. The collector electrode of transistor 50 is connected to the base electrode of transistor 60 and the emitter electrode of transistor 50 is connected to the base electrode of transistor 62, as shown. The emitter electrode of transistor 62 is connected to ground and the emitter electrode of transistor 60 is connected to the collector electrode of transistor 62 through a Schottky diode 64. The collector electrode of transistor 60 is connected to a $+V_{CC}$ power source as shown. The collector electrode of transistor 62 provides an output on line $\overline{A_0}'$. A transistor 68 has its emitter electrode connected to ground through a resistor 70 and the base electrode connected to the collector electrode of transistor 44, as shown. The collector electrode of transistor 68 is connected to $+V_{CC}$ through a resistor 72 and to the base electrode of transistor 74. The collector electrode of transistor 74 is also connected to $+V_{CC}$ and the emitter electrode of transistor 74 is connected to the collector electrode of transistor 76 through a Schottky diode 78. Transistor 76 has its emitter electrode connected to ground and the collector electrode connected to line $A_0'$, as shown. It is first noted that when a $+V_{CC}$ ($\approx 5$ volts) supply is coupled to the power bus PS (i.e. when the ROM 10 is placed in the read enable mode) if a logical 0 signal is fed to terminal $A_0$, that is a relatively "low" voltage (<0.8 volts) transistor 41 is placed in a conducting condition the emitter electrode thereof is at a relatively "low" potential with the result that transistor 44 is placed in a non-conducting condition and a relatively "high" voltage produced at the collector electrode thereof is coupled to the base electrode of transistor 68 placing such transistor 68 in a conducting condition and driving the transistor 76 into saturation thereby producing a relatively "low" (i.e. $\approx 0.3$ volts) voltage at the output line $A_0'$. Thus, the signal on line $A_0'$ represents the "true" signal of the logical signal fed to terminal $A_0$. On the other hand, since transistor 44 is placed in a non-conducting condition along with transistor 50 a relatively "high" voltage is produced at the collector output of transistor 62 thereby resulting in a relatively "high" voltage (i.e. >2.4 volts) being produced on line $\overline{A_0}'$. Conversely, in response to a logical 1 or "high" (i.e. >2.4 volts) voltage at the terminal $A_0$, transistor 41 is placed in a non-conducting condition and current from the $+V_{CC}$ supply which is fed to power bus PS, passes through resistor 44 and diode 48 to place transistor 44 in a conducting condition thereby lowering the voltage at the collector electrode of transistor 44 and placing transistors 68 and 76 in a non-conducting condition with the result that the voltage on line $A_0'$ goes to a relatively "high" voltage (i.e. >2.4 volts) or to a logical 1 condition. With transistor 44 placed in a conducting condition and transistor 50 placed in a conducting condition sufficient current is fed to the base electrode of transistor 62 driving such transistor into saturation and producing a relatively "low" voltage (i.e. <0.8 volts) on line $\overline{A_0}'$. It is also noted that in the absence of a voltage fed to power bus PS (i.e. when the buffer $34_0$ is not in the enable mode but is rather in the standby mode) the $+V_{CC}$ supply fed to the collector electrode of transistor 60 and to the collector electrode of transistor 74 places a relatively "high" voltage on the collector electrodes of transistors 62 and 76 thereby forcing such buffer $34_0$ to produce a logical 1 output on both lines $A_0'$ and $\overline{A_0}'$. In effect then, referring to FIG. 1 when in the standby mode (i.e. when $+V_{CC}$ is not coupled to power bus PS) logical "1" signals are produced on both lines $A_0'$ and $\overline{A_0}'$; however, when $V_{CC}$ is coupled to power bus PS, the lines $A_0'$, $\overline{A_0}'$ produce the "true" and "complement" of the signal fed to terminal $A_0$. It is further noted that while buffers $34_0$, $34_1$ are coupled to power bus PS, buffers $34_2$-$34_6$ are coupled to power bus PS'. As will be described in detail hereinafter, when the terminal $\overline{E}$ is fed with an enable signal to remove memory 10 from the standby mode and to thereby place the memory 10 in the enable mode, read enable section 20 initially couples $+V_{CC}$ to power bus PS via switch 19 thereby enabling buffers $34_0$, $34_1$ to produce on lines $A_0'$, $A_1'$ and $\overline{A_0}'$, $\overline{A_1}'$ "true" and "complement" signals of the signals fed to terminals $A_0$, $A_1$, as described above. It is noted, however, that the coupling of $+V_{CC}$ to bus PS' is delayed a predetermined period of time by a delay circuit 43. That it is only after a short time after switch 19 couples the $+V_{CC}$ to power bus PS that $+V_{CC}$ is coupled, via power bus PS', to buffers $34_2$-$34_6$ to thereby power enable such buffers $34_2$-$34_6$. The result is that during the delay time buffers $34_2$-$34_6$ are disabled and lines $A_2'$-$A_6'$ and $\overline{A_2}'$-$\overline{A_6}'$ produced high or logical "1" signals. As will be described in detail hereinafter, the effect of producing logical 1 signals on lines $A_2'$-$A_6'$ and $\overline{A_2}'$-$\overline{A_6}'$ during the short time delay interval (as a result of the delay circuit 43) is to couple 32 of the 127 row conductors $24_0$-$24_{127}$ to ground potential and thereby remove the relatively "high" voltage produced on these 32 conductors when the memory circuit 10 was in the standby mode. It is also noted that, however, prior to the application of a $+V_{CC}$ voltage on line PS (i.e. while in the standby mode) there is substantially no current flow through the inverter/buffers $34_0$–$34_6$ and hence there is no substantial power consumed by the resistors in such inverter/buffers $34_0$–$34_6$.

Figure 3:
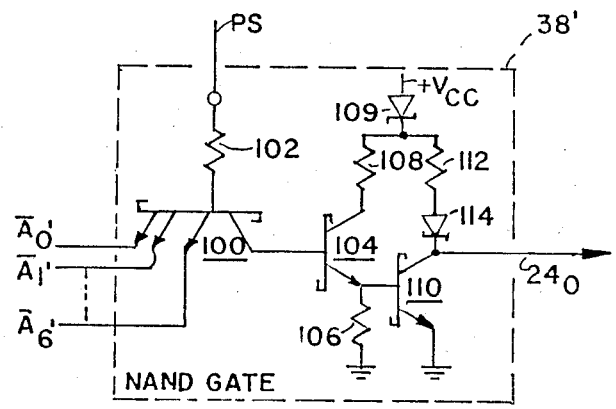
FIG. 3 is a schematic diagram of a NAND gate used in the PROM circuit of FIG. 1.

Referring again to FIG. 1, it is noted then that prior to the application of a voltage on line PS (while in the standby mode) the outputs of inverter/buffers $34_0$–$34_6$ produce a relatively "high" or logical 1 signal. The outputs of inverter/buffers $34_2$–$34_6$ are coupled to a bus 60, here a ten-line bus, which includes lines $A_2'$, $\overline{A_2}'$, $A_3'$, $\overline{A_3}'$, $A_4'$, $\overline{A_4}'$, $A_5'$, $\overline{A_5}'$, $A_6'$, $\overline{A_6}'$ which lines feed the X decoder section 36 of the X addressing section. The X decoder section includes 32 NAND gate sections $62_0$–$62_{31}$, each section having four NAND gates $38_1$–$38_4$, as shown in detail for NAND gate section $62_0$. Each one of the NAND gates $38_1$–$38_4$ in each one of the 32 sections is identical in construction, and an exemplary one thereof, here NAND gate $38_1$, is shown in FIG. 3 to include an input multi-emitter transistor 100 having a base electrode coupled to power bus PS through a resistor 102 and a collector electrode connected to the base electrode of transistor 104. The emitter electrode of transistor 104 is connected to ground through a resistor 106. The collector of transistor 104 is connected to $+V_{CC}$ through a resistor 108 and Schottky diode 109. The emitter electrode of transistor 104 is also coupled to the base of transistor 110. The emitter electrode of transistor 110 is connected to ground and the collector electrode of transistor 110 is coupled to a $+V_{CC}$ source through a resistor 112 and Schottky diodes 109 and 114, as shown. The collector electrode of the transistor 110 provides an output for the NAND gate and is here indicated as line $24_0$. It is noted that in the absence of a voltage fed to power bus PS (i.e. in the standby mode) the output line is at a relatively "high" voltage. However, in the absence of such voltage fed to power bus PS (i.e. in the standby mode) the transistors 100, 104, 110 are in a non-conducting condition and hence substantially no power is consumed by the resistors in such NAND gate. In the presence of a voltage coupled to power bus PS (i.e. in the read enable mode), however, the output of the NAND gate $38_1$ will produce at its output on line $24_0$ either a relatively "high" voltage or a relatively "low" voltage depending upon the logical states of the signals fed to the emitter electrodes of transistors 100. Thus if all of the signals fed to the emitter electrodes of transistors 100 (here lines $\overline{A_0}'$, $\overline{A_1}'$, $\overline{A_2}'$, $\overline{A_3}'$, $\overline{A_4}'$, $\overline{A_5}'$ and $\overline{A_6}'$) are "high" (i.e. logical 1), transistor 100 is placed in a non-conducting condition and current flows through resistor 102 to the base electrode of transistor 104 placing such transistor 104 in conduction and driving transistor 110 into saturation producing a relatively "low" voltage on line $24_0$. However, if any one of the emitter electrodes of transistor 100 has a "low" voltage (i.e. a logical 0) fed thereto transistor 100 is placed in a conducting condition and transistors 104 and 110 are placed in non-conducting conditions with the result that a relatively high voltage is produced on line $24_0$. The NAND gates $38_1$–$38_4$ of the NAND gate section $62_0$–$62_{31}$ are coupled to lines $A_0'$–$A_6'$, $\overline{A_0}'$–$\overline{A_6}'$ in accordance with the following Table I:

TABLE I

| NAND GATE | NAND GATE SECTION | LINES |
|---|---|---|
| $38_1$ | $62_0$ | $\overline{A_6}',\overline{A_5}',\overline{A_4}',\overline{A_3}',\overline{A_2}',\overline{A_1}',A_0'$ |
| $38_2$ | " | $\overline{A_6}',\overline{A_5}',\overline{A_4}',\overline{A_3}',\overline{A_2}',A_1',\overline{A_0}'$ |
| $38_3$ | " | $\overline{A_6}',\overline{A_5}',\overline{A_4}',\overline{A_3}',\overline{A_2}',A_1',A_0'$ |
| $38_4$ | " | $\overline{A_6}',\overline{A_5}',\overline{A_4}',\overline{A_3}',A_2',\overline{A_1}',\overline{A_0}'$ |
| $38_1$ | $62_1$ | $\overline{A_6}',\overline{A_5}',\overline{A_4}',\overline{A_3}',A_2',\overline{A_1}',A_0'$ |
| $38_2$ | " | $\overline{A_6}',\overline{A_5}',\overline{A_4}',\overline{A_3}',A_2',A_1',\overline{A_0}'$ |
| $38_3$ | " | $\overline{A_6}',\overline{A_5}',\overline{A_4}',\overline{A_3}',A_2',A_1',A_0'$ |
| $38_4$ | " | $\overline{A_6}',\overline{A_5}',\overline{A_4}',A_3',\overline{A_2}',\overline{A_1}',\overline{A_0}'$ |
| $38_1$ | $62_2$ | $\overline{A_6}',\overline{A_5}',\overline{A_4}',A_3',\overline{A_2}',\overline{A_1}',A_0'$ |
| $38_2$ | " | $\overline{A_6}',\overline{A_5}',\overline{A_4}',A_3',\overline{A_2}',A_1',\overline{A_10}'$ |
| $38_3$ | " | $\overline{A_6}',\overline{A_5}',\overline{A_4}',A_3',\overline{A_2}',A_1',A_0'$ |
| $38_4$ | " | $\overline{A_6}',\overline{A_5}',\overline{A_4}',A_3',A_2',\overline{A_1}',\overline{A_0}'$ |
| $38_1$ | $62_3$ | $\overline{A_6}',\overline{A_5}',\overline{A_4}',A_3',A_2',\overline{A_1}',A_0'$ |
| $38_2$ | " | $\overline{A_6}',\overline{A_5}',\overline{A_4}',A_3',A_2',A_1',\overline{A_0}'$ |
| $38_3$ | " | $\overline{A_6}',\overline{A_5}',\overline{A_4}',A_3',A_2',A_1',A_0'$ |
| $38_4$ | " | $\overline{A_6}',\overline{A_5}',A_4',\overline{A_3}',\overline{A_2}',\overline{A_1}',\overline{A_0}'$ |
| $38_1$ | $62_4$ | $\overline{A_6}',\overline{A_5}',A_4',\overline{A_3}',\overline{A_2}',\overline{A_1}',A_0'$ |
| . | . | . |
| . | . | . |
| . | . | . |
| $38_1$ | $62_{30}$ | $\overline{A_6}',A_5',A_4',A_3',A_2',\overline{A_1}',\overline{A_0}'$ |
| $38_2$ | " | $\overline{A_6}',A_5',A_4',A_3',A_2',A_1',\overline{A_0}'$ |
| $38_3$ | " | $\overline{A_6}',A_5',A_4',A_3',A_2',A_1',A_0'$ |
| $38_4$ | " | $A_6',A_5',A_4',A_3',A_2',\overline{A_1}',\overline{A_0}'$ |
| $38_1$ | $62_{31}$ | $A_6',A_5',A_4',A_3',A_2',\overline{A_1}',A_0'$ |
| $38_2$ | " | $A_6',A_5',A_4',A_3',A_2',A_1',\overline{A_0}'$ |
| $38_3$ | " | $A_6',A_5',A_4',A_3',A_2',A_1',A_0'$ |
| $38_4$ | " | $A_6',A_5',A_4',A_3',A_2',A_1',A_0'$ |

It follows then from Table I above that in the enable mode, i.e. when power is coupled to the inverter/buffers $34_0$–$34_6$ and to the NAND gate sections $62_0$–$62_{31}$, one of the columns of conductors $24_0$–$24_{127}$ is addressed by being coupled to a "low" voltage in response to addressing signals fed to terminals $A_0$–$A_6$ in accordance with the following TABLE II:

TABLE II

| Addressed Row Conductor | Terminal Signal | | | | | | |
|---|---|---|---|---|---|---|---|
| | $A_0$ | $A_1$ | $A_2$ | $A_3$ | $A_4$ | $A_5$ | $A_6$ |
| $24_0$ | 0 | 0 | 0 | 0 | 0 | 0 | 0 |
| $24_1$ | 0 | 0 | 0 | 0 | 0 | 0 | 1 |
| $24_2$ | 0 | 0 | 0 | 0 | 0 | 1 | 0 |
| . | . | . | . | . | . | . | . |
| . | . | . | . | . | . | . | . |
| $24_{126}$ | 0 | 1 | 1 | 1 | 1 | 1 | 1 |
| $24_{127}$ | 1 | 1 | 1 | 1 | 1 | 1 | 1 |

It is noted that prior to the application of a voltage to power bus PS (i.e. when in the standby mode) all of the signals on the outputs of the inverter/buffers $34_0$–$34_6$ are all "high" or logical 1 signals and also all of the voltages produced on the outputs of the NAND $38_1$–$38_4$ gates in X decoder section 36 are at relatively "high" voltages. Thus, prior to the application of such voltage on power bus PS, a relatively "high" voltage is developed between the row conductors $24_0$–$24_{127}$ and the grounded substrate 12 itself. That is the row conductors $24_0$–$24_{127}$ and the substrate 12 provide in effect a large capacitance which must be discharged prior to full enablement of the memory circuit 10. In initial response to a read enable signal fed to terminal $\overline{E}$, the read enable circuit 20 activates switch 19 (FIG. 1) to couple the $+V_{CC}$ source to all of the NAND gate sections $62_0$–$62_{31}$ and to inverter/buffers $34_0$, $34_1$ via power bus PS. It is noted, however, that the $+V_{CC}$ voltage is not electrically coupled to the power bus PS' of inverter/buffers $34_2$–$34_6$ until a finite delay provided by delay circuit 43. Thus while "true" and "complementary"

signals are fed to the lines $A_0'$, $A_1'$, $\overline{A}_0'$, $\overline{A}_1'$ in response to logic signals fed to terminals $A_0$, $A_1$ only relatively "high" voltages (i.e. logic "1" signals) are produced on lines of $A_2$, $\overline{A}_2'$, through $A_6$, $\overline{A}_6'$ with the result that a relatively "high" voltage or logic 1 signal is fed to all of the inputs of at least one of the NAND gates $38_1$–$38_4$ in each of the 32 NAND gate sections $62_0$–$62_{31}$. Consequently, during this delay period, or pre-enable period, 32 of the 127 row conductors are coupled to ground to thereby discharge the voltage previously appearing on these row conductors during the standby mode. After the expiration of this predetermined, pre-enable period of time, the $+V_{CC}$ voltage is coupled via the power bus PS', and hence to the inverter/buffer circuits $34_2$–$34_6$, thereby placing the memory 10 in the full enable mode and allowing the NAND gate sections $62_0$–$62_{31}$ to respond to the addressing signals on terminals $A_0$–$A_6$ and allow such NAND decoder section 36 to address only a selected one of the rows of conductors $24_0$–$24_{127}$ by coupling such selected one of the conductors to ground potential.

The Y addressing circuit 18 (FIG. 1) includes five inverter/buffers $34_7$–$34_{11}$ coupled to terminals $A_7$–$A_{11}$, respectively, as shown. Each one of the buffers $34_7$–$34_{11}$ is equivalent in construction to the buffer $34_0$. It is noted that the buffers $34_7$–$34_{11}$ are coupled to power bus PS, as shown. Thus, inverter/buffers $34_7$–$34_{11}$ produce "true" and "complement" signals on lines $A_7'$–$A_{11}'$ and $\overline{A}_7'$–$\overline{A}_{11}'$ representative of the "true" and "complementary" signals of the bits fed to terminals $A_7$–$A_{11}$, respectively. The signals on lines $A_7'$, $\overline{A}_7'$, $A_{11}'$, $\overline{A}_{11}'$ are fed to a plurality of, here 4 Y decode/output circuits $35_1$–$35_4$, as shown. Each one of the Y decode/output circuits $35_1$–$35_4$ is coupled to a corresponding one of the output terminals $O_1$–$O_4$, respectively, as shown. Each one of the Y decode/output circuits $35_1$–$35_4$ is identical in construction. It follows then that, in response to binary signals fed to terminals $A_7$–$A_{11}$, one of the column conductors coupled to such Y decoder is selective in accordance with the binary signal fed to such terminals $A_7$–$A_{11}$. In particular, the following column conductors are selected in response to the binary signals fed to terminals $A_7$–$A_{11}$ in accordance with the following Table III:

TABLE III

| $A_{11}$ | $A_{10}$ | $A_9$ | $A_8$ | $A_7$ | Column Conductors |
|---|---|---|---|---|---|
| 0 | 0 | 0 | 0 | 0 | $28_0$ |
| 0 | 0 | 0 | 0 | 1 | $28_1$ |
| . | . | . | . | . | . |
| . | . | . | . | . | . |
| . | . | . | . | . | . |
| 0 | 1 | 1 | 1 | 1 | $28_{30}$ |
| 1 | 1 | 1 | 1 | 1 | $28_{31}$ |

The presence or absence of a diode memory element 33 at the selected row and column conductors indicates storage of a logical 1 or logical 0 skill. Thus, the voltage on the selected column conductor will be relatively high or relatively low depending on the logical state of the selected memory element. The voltage on the selected column conductor is connected to terminal $O_1$, as shown. Thus, once programmed, the memory 10 may be read by coupling a read enable signal to terminal $\overline{E}$ (here a "low" voltage) to allow reading of the data programmed into the memory array. When such memory circuit 10 is placed in the full read enable condition, that is after the initial pre-enable condition, as discussed above, the logical state of a memory element is determined by selecting the particular row conductor and column conductor containing such memory element and coupling the voltage on such column conductor to the output terminal.

Having described a preferred embodiment of the invention, it will now be apparent to one of skill in the art that other embodiments incorporating this concept may be used. For example, while 32 of 128 rows of conductors were coupled to ground potential during the pre-enable condition, this number may change since it is a result of a trade off between the delay in full enablement of the circuit resulting from the switching device's inherent response time delay to the full enable signal and the delay resulting from the effect of the capacitance between the row conductors and the grounded substrate. Hence, the actual number of row conductors to be switched low during the pre-enable mode is generally the result of a trial and error procedure. It is felt, therefore, that this invention should not be limited to the disclosed embodiment, but rather should be limited only by the spirit and scope of the appended claims.

What is claimed is:

1. An integrated circuit memory comprising:
   (a) a substrate coupled to ground potential;
   (b) a matrix of memory elements interconnected by rows and columns of conductors, said rows and columns of conductors being disposed on the substrate;
   (c) addressing means, coupled between a source of addressing signals and the rows of conductors, for coupling the rows of conductors to a high potential relative to ground potential independent of the addressing signals when such addressing means is decoupled from a power bus and for coupling only a selected one of the rows of conductors to ground potential to address the ones of the memory elements coupled to said selected ones of the rows of conductors when the entire addressing means is coupled to the addressing bus, such one of the rows of conductors being selected in accordance with the addressing signals; and,
   (d) switch means, responsive to an enable signal, for decoupling the entire addressing means from the power bus in response to a stand-by condition of the enable signal, for coupling a portion of the addressing means to the power bus when the enable signal changes from the stand-by condition to an enable condition during an initial portion of the enable condition to couple a portion of the rows of conductors to substantially ground potential and for subsequently coupling the entire addressing means to the power bus during a subsequent full enable condition to couple the selected one of the rows of conductors to substantially ground potential to address the ones of the memory elements coupled to such selected one of the rows of conductors, such one of the rows being selected in accordance with addressing signals provided by the addressing signal source.

2. The integrated circuit memory recited in claim 1 wherein the addressing means comprises:
   (a) a plurality of inverter buffer circuits having inputs coupled to the addressing signal source;
   (b) a decoder section fed by signals produced by the inverter/buffer circuits and having outputs connected to the plurality of rows of conductors; and (c) wherein the switch means includes means for coupling the power bus to the decoder section and a portion of the plurality of inverter/buffer circuits during the initial enable condition and for coupling such power bus to the entire plurality of inverter/buffer circuits during the subsequent full enable condition.

3. The integrated circuit memory recited in claim 2 wherein the switch means decouples the power bus from the decoder section in response to the enable signal, and wherein the decoder section includes means for producing:
 (a) relatively high voltages at the outputs of such decoder section during the standby condition when the entire addressing means is decoupled from the power bus;
 (b) relatively low voltages at a portion of the outputs of the decoder section during the initial portion of the enable condition; and
 (c) a relatively low voltage at a selected one of the outputs of the decoder section during the subsequent full enable condition.

* * * * *